(12) United States Patent
Brunelli et al.

(10) Patent No.: US 6,331,213 B1
(45) Date of Patent: Dec. 18, 2001

(54) BRUSH ALIGNMENT METHOD (75) Inventors: Shon Brunelli; Timothy Kennedy, both of Boise; Bryan Ludwig, Meridian, all of ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/481,052

(22) Filed: Jan. 11, 2000

Related U.S. Application Data (62) Division of application No. 09/055,720, filed on Apr. 6, 1998, now Pat. No. 6,076,217.

(51) Int. Cl.⁷ .................................................... B08B 7/00
(52) U.S. Cl. ................................ 134/6; 134/2; 134/42; 134/902; 29/895.21; 29/895.23; 29/450; 15/179; 15/230; 15/230.14; 15/230.16; 15/230.18
(58) Field of Search .................... 29/895.21, 895.23, 29/450; 15/179, 230, 230.14, 230.16, 230.18; 134/2, 6, 42, 902

(56) References Cited

U.S. PATENT DOCUMENTS

| | | |
|---|---|---|
| 1,560,558 | 11/1925 | Fulton . |
| 3,939,521 | 2/1976 | Clark ........................................ 15/179 |
| 4,054,743 * | 10/1977 | Mayer et al. ........................... 29/450 |
| 4,175,300 | 11/1979 | McGlew et al. ..................... 15/103.5 |
| 4,597,127 | 7/1986 | Swanson .................................. 15/24 |
| 5,046,231 * | 9/1991 | Thompson .............................. 29/450 |
| 5,072,504 * | 12/1991 | Thompson ......................... 29/895.23 |
| 5,114,557 | 5/1992 | Jahani .................................. 204/206 |
| 5,143,573 * | 9/1992 | Ammon et al. ......................... 29/450 |
| 5,144,711 | 9/1992 | Gill, Jr. ................................. 15/97.1 |
| 5,262,694 | 11/1993 | Frank .................................... 310/239 |
| 5,325,566 | 7/1994 | Jahani .................................. 15/302 |
| 5,361,449 | 11/1994 | Akimoto ................................ 15/302 |
| 5,375,291 | 12/1994 | Tateyama et al. ..................... 15/302 |
| 5,475,889 | 12/1995 | Thrasher et al. ...................... 15/88.3 |
| 5,639,311 | 6/1997 | Holley et al. ............................ 134/6 |
| 5,675,856 | 10/1997 | Itzkowitz ................................. 15/77 |
| 5,745,945 | 5/1998 | Manfredi et al. ........................ 15/77 |
| 5,752,444 * | 5/1998 | Lorig .................................... 101/375 |
| 5,806,126 | 9/1998 | de Larios et al. ..................... 15/102 |
| 5,858,109 | 1/1999 | Hymes et al. ........................... 134/2 |
| 5,868,863 * | 2/1999 | Hymes .................................. 134/28 |
| 5,937,469 * | 8/1999 | Culkins et al. ......................... 15/179 |
| 5,987,748 * | 11/1999 | Calloway ......................... 29/895.23 |
| 6,076,217 * | 6/2000 | Brunelli et al. .......................... 15/77 |

* cited by examiner

*Primary Examiner*—Sharidan Carrillo
(74) *Attorney, Agent, or Firm*—Kirkpatrick & Lockhart LLP (57) ABSTRACT

A brush alignment apparatus and method of using the same for aligning a hollow cylindrical brush on a cylindrical roller member comprising first and second ends and an outer surface defining a internal cavity, provided with a plurality of orifices extending from the outer surface to the internal cavity, a first receptacle having a channel running therethrough in fluid communication with the first end of the roller member, a second receptacle, a spine member, a first support arm supporting the first end of the roller member and a second arm supporting the second end of the roller member. In operation, the brush is applied onto the surface of the roller such that the inner surface of the brush and the outer surface of the roller are in frictional communication with one another, a layer of fluid is generated between the surfaces of the roller and the brush sufficient to substantially dissipate any frictional contact between the brush and the roller, the layer is maintained between the surfaces of the roller and the brush for sufficient time and at sufficient strength to allow the brush to attain a position of static alignment, at which time the layer is allowed to dissipate thereby returning the brush to a position of frictional communication with the surface of the roller, while substantially retaining it in a state of static alignment.

19 Claims, 7 Drawing Sheets

BRUSH ALIGNMENT METHOD

CROSS REFERENCE TO RELATED APPLICATIONS

This is a divisional application of U.S. Pat. No. 6,076,217 which resulted from U.S. patent application Ser. No. 09/055,720 filed on Apr. 6, 1998.

FEDERALLY SPONSORED RESEARCH

Not Applicable

BACKGROUND OF THE INVENTION

1. Field of the Invention

The present invention relates to a brush alignment platform and, more particulary, to an alignment jig that provides for the disposition of a brush on a roller, in static alignment, by creating a layer of fluid beneath the brush to successively unseat the brush from the roller and bring the brush substantially into static alignment a

2. Description of the Invention Background

As is known in the art, in the course of the process of manufacturing a semiconductor device, impurities will become deposited on the surface of the semiconductor wafer or substrate. If these contaminants are allowed to remain in the wafer throughout the manufacturing process, the quality and the yield of the production process will be negatively affected. Therefore, various cleaning processes are typically employed throughout the manufacturing process in an attempt to eliminate these impurities from the surface of the semiconductor.

One such known cleaning apparatus includes rotating a substantially cylindrical brush, having a plurality of cleaning tips thereon, along the surface of the semiconductor to remove impurities. In practice, the brush has a length equal to or greater than the diameter of the wafer to be cleaner The cylindrical brush is manually seated onto a roller shaft. The shaft is then mechanically rotated about its axis while being moved along a diameter of the wafer. In the alternative, the wafer itself is also rotated about its center point while the brush is rotated about its axis. In either case, the cleaning tips are brought into contact with the surface of the wafer while a cleaning solution is introduced onto the surface of the wafer. As such, the entire surface of the wafer is contacted and cleaned by the rotating action of the cleaning tips. As described, the cleaning apparatus can be employed to clean either the top or bottom side of the semiconductor wafer. Such wafer cleaning apparatus are known in the art by and sold under the trademark of On-Trak™ by OnTrak Systems, Inc of Milpitas, Calif.

In such a cleaning apparatus, for the brush to successfully clean the surface of the wafer, it is critical that the brush be evenly disposed along the length of the roller shaft so that the cleaning tips are evenly aligned throughout the surface of the brush. However, due to the need for the brush to be in close communication with the surface of the roller, the inner diameter of the brush is designed to be equal to or less than the outer diameter of the roller. Therefore, it is necessary to manually deform and stretch the brush to fully seat it onto the roller. Manual application of the brush is very difficult to accomplish without twisting and unevenly disposing the brush along the shaft. Such a misalignment of the brush creates an uneven placement of the cleaning tips about the surface area of the brush which ultimately leads to an uneven cleaning of the surface of the wafer by the brush. The most common method of aligning the brush is to manually re-seat it onto the shaft. This method involves applying and aligning the brush by hand. Typically, it is time consuming and only partially effective.

Increasing the inner diameter of the brush will decrease the tendency for the brush to be unevenly disposed along the shaft. However, increasing the diameter of the brush will also decrease the frictional contact between the brush and the shaft. This typically leads to slippage between the brush and the roller which causes premature wearing of the brush and uneven cleaning of the wafer. Thus, increasing the diameter of the brush to eliminate this problem is undesirable. Other methods designed to reduce the misalignment of the brush on the shaft, such as lubricating the points of contact between the brush and the shaft, also lead to such slipping and are thus equally undesirable Thus, the only suitable method known in the art-of aligning the brush on the roller is to do so by hand. This manual alignment process is typically slow, cumbersome and only partially effective. None of the known cleaning apparatus in the prior art provide an adequate solution to the problem of proper brush alignment.

The subject invention is thus directed toward a brush alignment apparatus and method which addresses, among others, the above-discussed needs and provides an apparatus and method for aligning a cleaning brush on a roller such that it is evenly disposed about the entire surface area of the shaft with minimal effort and time expended by the operator.

SUMMARY OF THE INVENTION

The present invention provides a brush alignment apparatus and method for installing brushes onto a roller in a uniformly disposed manner. This invention also provides a brush alignment apparatus and method that allows for the installation of brushes onto rollers with decreased effort and time expended on the part of the operator. Further, the instant invention serves to provide a brush alignment apparatus and method that provides for improved operation and performance of the brush.

In accordance with a preferred form of the present invention, there is provided a brush alignment apparatus and jig. The brush alignment apparatus and jig disclosed herein includes a roller having a internal cavity running therethrough and a plurality of orifices disposed about the outer surface of the roller that allow for fluid communication between the internal cavity and outer the surface of the roller. A source of pressurized fluid is provided in communication with the internal cavity, such that when a brush is disposed upon the roller and fluid is fed into the internal cavity, the fluid will flow through the plurality of orifices and create a layer of fluid between the outer surface of the roller and the inner surface of the brush. The rate at which the liquid or gas is fed through the cylinder is sufficient to distend the brush so that it is no longer substantially separated frictional communication with the outer surface of the roller and is substantially, separated from the roller by the layer of fluid While supported by this layer, the brush will return to its natural aligned state. When the flow of fluid is terminated, the layer of fluid between the outer surface of the roller and the inner surface of the brush becomes insufficient to support the distended brush and the brush contracts to again contact the outer surface of the roller. Though the brush is again in contact with the roller, the brush remains in its natural aligned state.

Accordingly, the present invention provides solutions to the problems associated with existing rollers and roller jigs.

The reader will appreciate that these and other details, objects and advantages will become apparent as the following detailed description of the present preferred embodiments thereof proceeds or may be learned from practice of the invention. The objects and advantages of the invention may be realized and obtained by means of the instrumentalities and combinations particularly set forth in the appended claims.

BRIEF DESCRIPTION OF THE DRAWINGS

In the accompanying drawings, preferred embodiments of the present invention are shown, wherein like reference numerals are employed to designate like parts and wherein.

DETAILED DESCRIPTION OF THE PREFERRED EMBODIMENTS

Referring now to the drawings for the purposes of illustrating preferred embodiments of the invention only, and not for purposes of limiting the same, the Figures generally show a brush alignment platform. More particularly and with reference to FIG. 1, a brush alignment platform is shown generally at 30 for aligning a brush 10 on a roller 8. The platform 30 generally supports a roller 8, with a internal cavity 20 running therethrough and a plurality of orifices 26 in the surface thereof that allow for fluid communication between the internal cavity 20 and the outside surface 9 of the roller 8.

Figure 1:
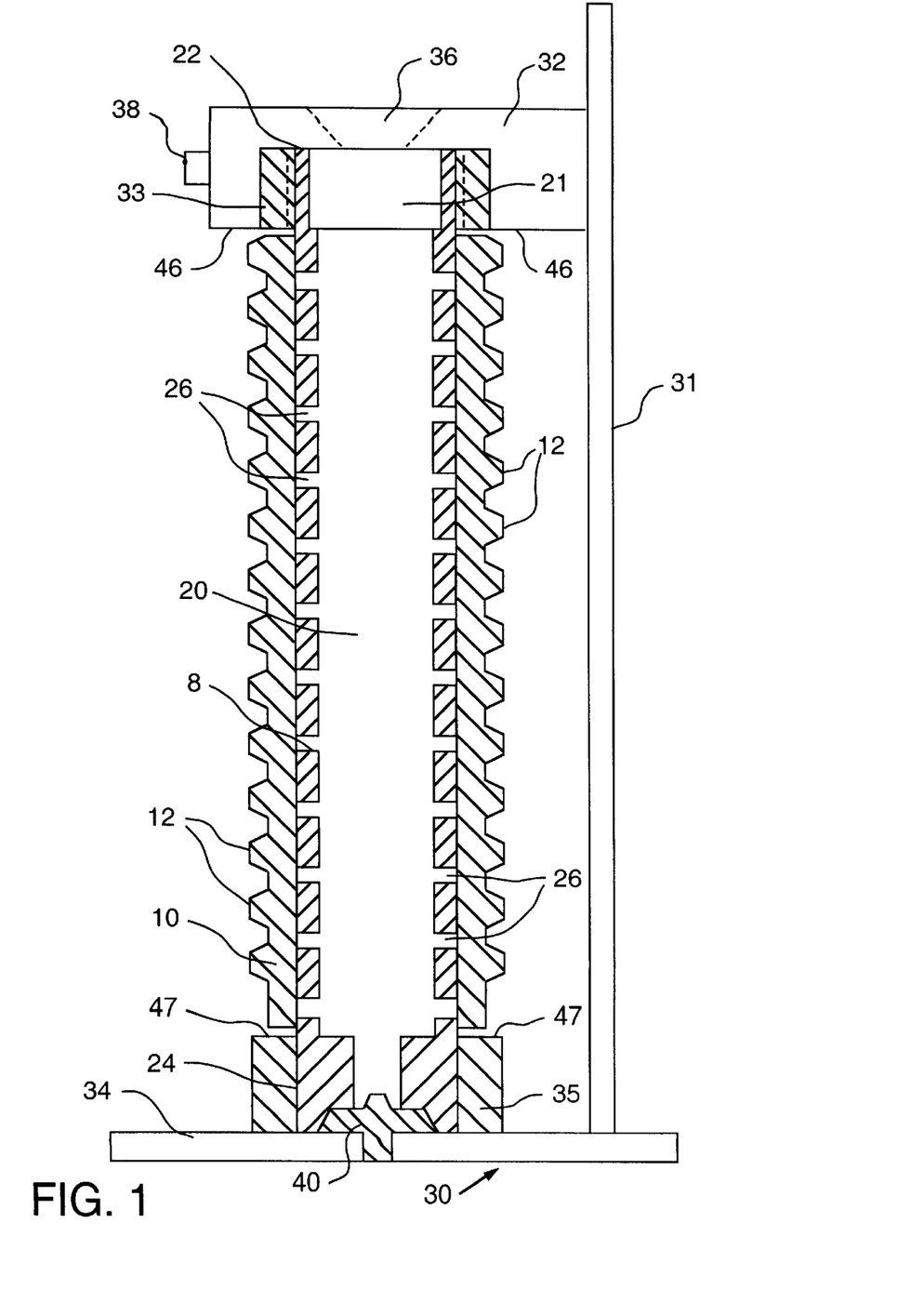
FIG. 1 is a cut-away side perspective view of an embodiment of the present invention in use on a platform apparatus.
Figure 2:
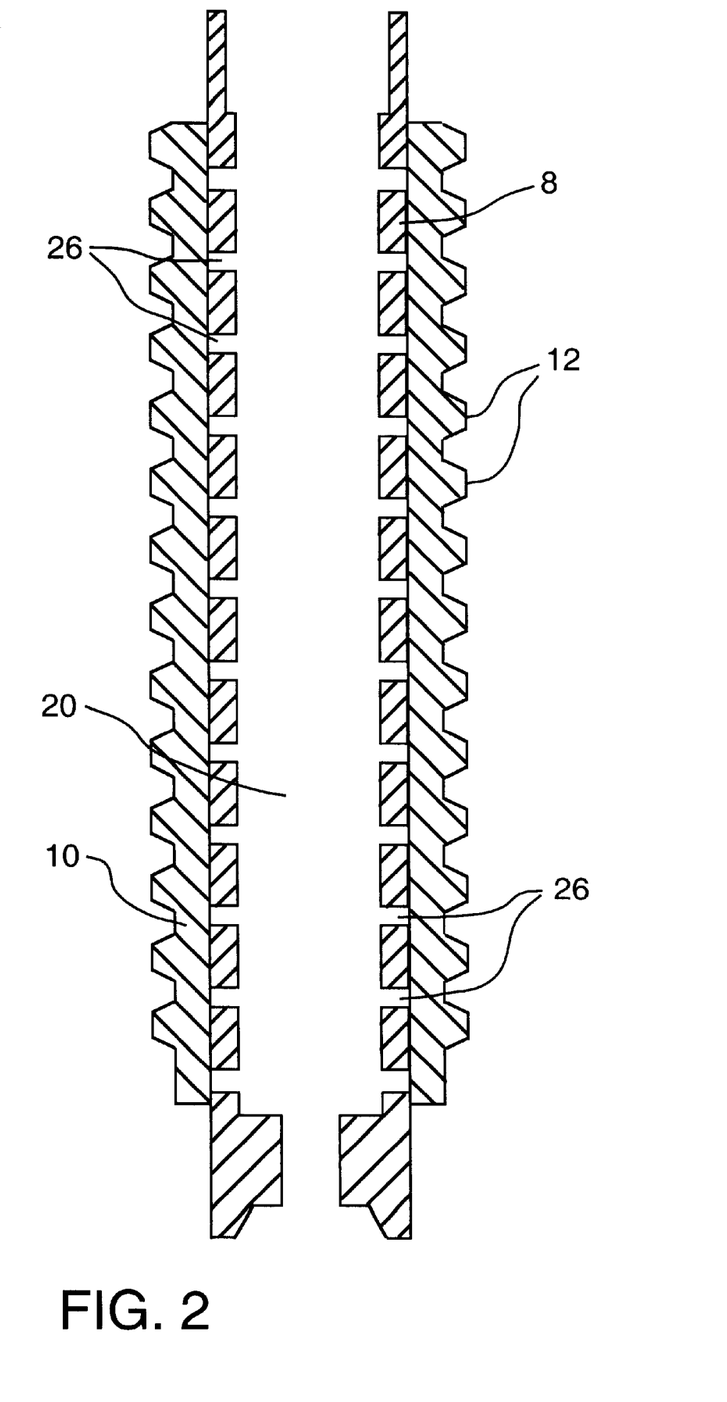
FIG. 2 is a cut-away side perspective view of the embodiment in FIG. 1.

The roller 8 is cylindrical in shape and has a generally circular cross section. The body of the roller 8 is substantially hollow and includes an internal cavity 20 running therethrough A plurality of orifices 26 are disposed about the outer surface 9 of the roller 8. The orifices 26 pass through the surface of the roller 8 and enter the internal cavity 20. As such, they are in fluid communication with the internal cavity 20 and provide for the free flow of liquid or gas between the internal cavity 20 and the surface 9 of the roller 8. At the distal ends of the roller are disposed caps 22 and 24, respectively. At one end, the cap 22 is provided with a channel 21 running therethrough substantially along the center axis of the cap 22. In the preferred embodiment, the channel 21 is of equal cross sectional area to the internal cavity 20 in the roller at one end of the cap 22 and tapers to a smaller cross sectional area at the other end of the cap 22. The channel 21 allows for fluid communication between the internal cavity 20 and the area outside of the roller 8. At the other end of the roller 8, the cap 24 is adapted to be removeably attached to a roller drive axle 40. As will be appreciated by one of ordinary skill in the art, such axles possess various shapes and thus cap 24 can also take various shapes as required to be attached to the drive axle 40.

The brush 10 is of a generally cylindrical shape. To allow for sufficient frictional contact between the brush 10 and the roller 8, the cross sectional dimensions of the inner surface 11 of the brush 10 are generally equal to or slightly smaller than those of the outer surface 9 of the roller 8 (see FIGS. 5 and 6). The brush 10 is preferably formed from a rubberized material such as polyvinyl alcohol (PVA), polyvinyl diflouride (PVDF), Teflon or the like. As such, the brush is flexible and has the property of being expandable, stretchable and deformable to beyond its normal size when pressure is applied thereto. In particular, the brush preferably has a 30% compressive stress of between 20–90 (g/cm$^3$), a tensile strength of between 100–300%, and a water absorption speed of between 700–1500% of weight.

In operation, when the brush 10 is displaced along the length of the roller 8, it is able to be stretched to fit over an outer surface 9 of the roller 8 that is at least as large or larger than the inner diameter of the brush 10. The friction alone generated by the contact between the outer surface 9 of the roller 8 and the inner surface 11 of the brush 10, is sufficient to hold the brush 10 is held in place without the need for additional adhesives or attachment devices.

Figure 4:
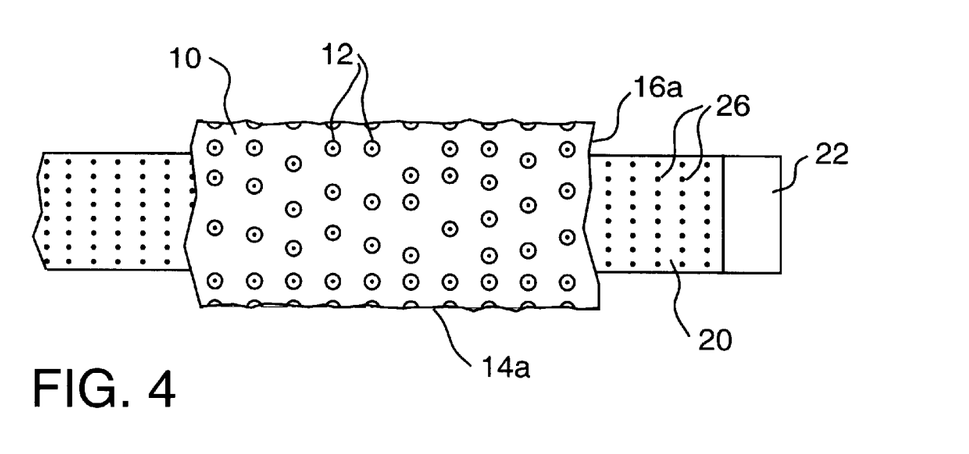
FIG. 4 is a side perspective view of the embodiment in FIG. 1 with a brush placed thereon, prior to alignment with the present invention.
Figure 5:
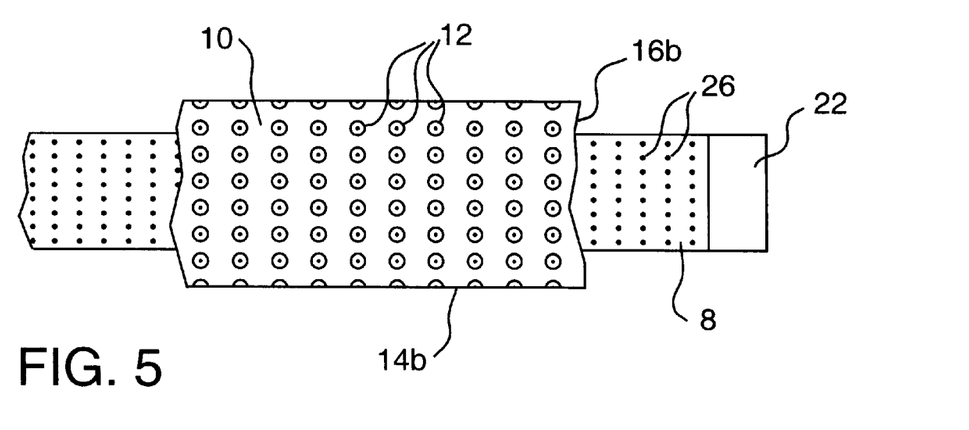
FIG. 5 is a side perspective view of the embodiment in FIG. 1 with a brush placed thereon from FIG. 4 after alignment with the present invention.
Figure 6:
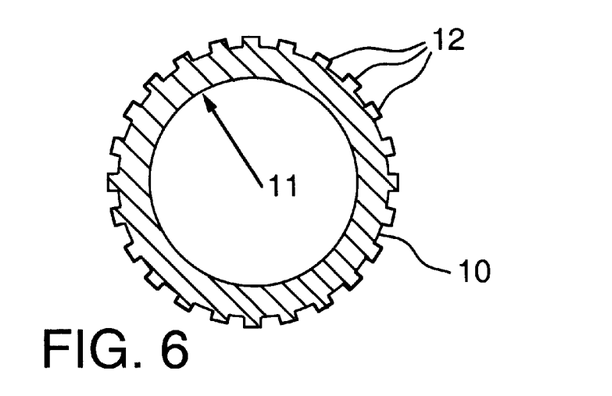
FIG. 6 is a cross-sectional view of the embodiment in FIG. 1 used in the preferred embodiment of the present invention.
Figure 7:
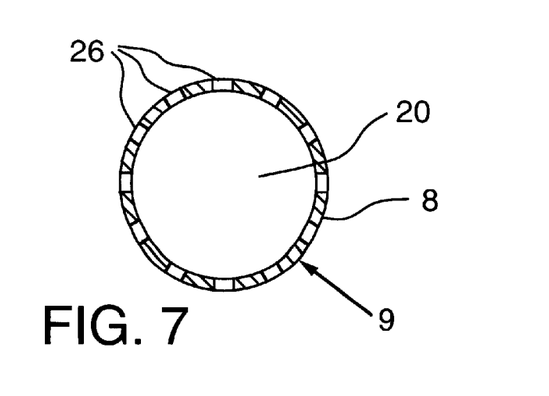
FIG. 7 is a cross-sectional view of the embodiment in FIG. 1 used in the preferred embodiment of the present invention.

The outside surface of the brush is provided with a plurality of bristles or tips 12. As seen in FIG. 5, when the brush is in a state of equilibrium, as defined by a state of rest in which the brush in uniform tension and has uniform consistency throughout, the tips 12 are preferably arrayed in a generally uniform pattern and the material of the brush 10 is displaced with equal thickness, consistency and tension throughout its entire outer surface 14b and at the end surface 16b. In operation, uniform scrubbing cannot occur unless the brush is maintained in this same uniform alignment even when fitted onto the roller 8 Though it is desirable to maintain this uniform alignment of the tips 12 even after the brush 10 is disposed upon the roller 8, the process of manually maneuvering the brush 10 in close frictional contact with the roller 8 creates great difficulties in achieving such a uniform array of the tips 12. As can be seen in FIG. 4, when the brush 10 is manually placed onto the roller 8, the brush 10 is displaced with unequal thickness and inconsistent tension throughout its entire outer surface 14a and end surface 16a.

Figure 10A:
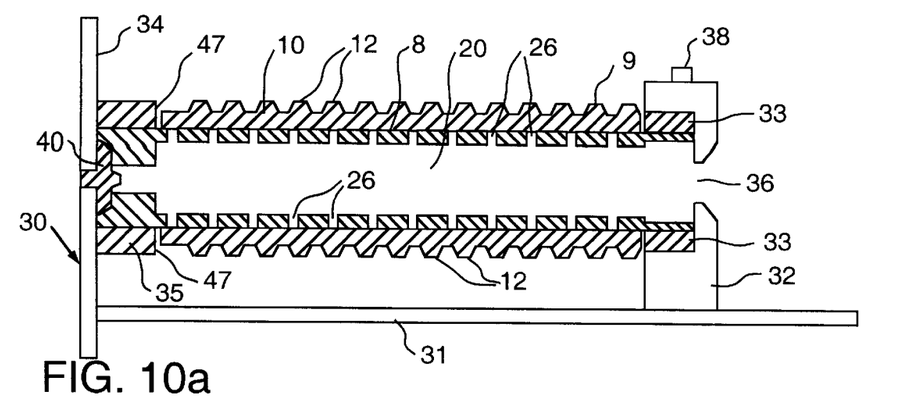
FIGS. 10a–c are side cross-sectional views of the embodiment in FIG. 1 being loaded and unloaded from the platform apparatus.
Figure 10B:
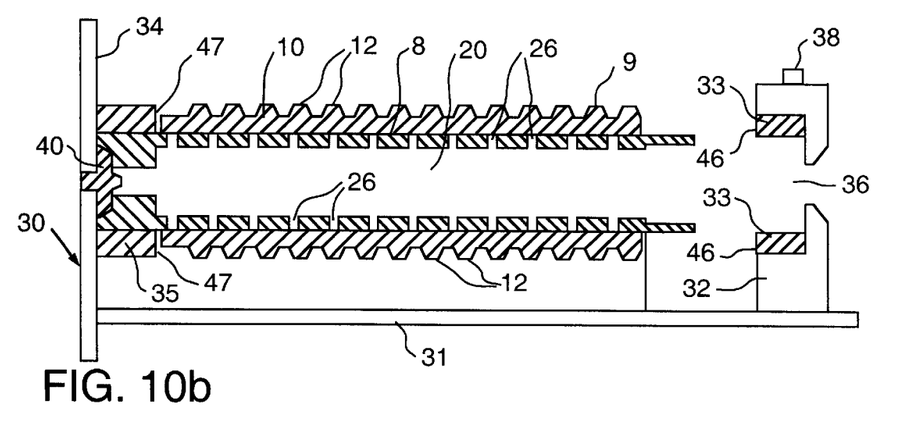
Figure 10C:
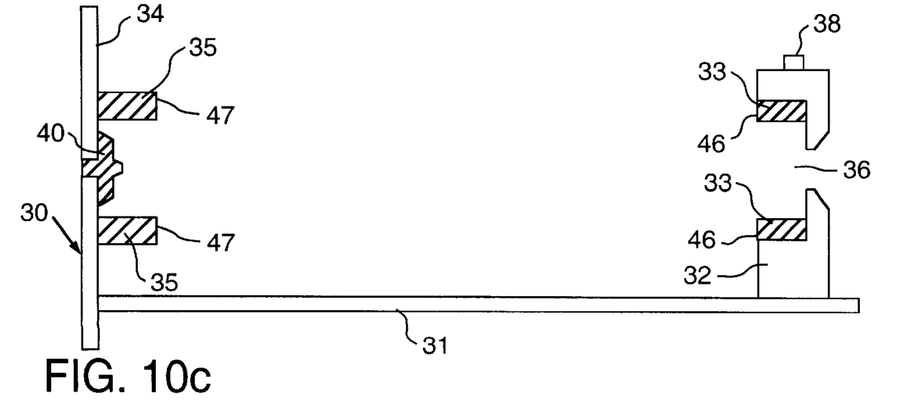

The alignment apparatus 30 includes upper and lower support arms 32 and 34, respectively, joined by a support spine 31. The arm 32 is further provided with an inlet 36 in fluid and gaseous communication with the channel 21 and the internal cavity 20 and is provided with threads, clamps or some other means of accepting the nozzle of a fluid source. The brush arm 32 is biasable along the spine 31 between an open position in which the end 24 of roller 8 may be inserted into the bottom receptacle 35 in the lower arm 34, and a closed position in which the both ends 22 and 24 of roller 8 are inserted into receptacles 33 and 35, respectively, and the apparatus is ready for operation (FIGS. 10a–c). An adjustment button 38 is provided on the top brush arm 32 to regulate movement of the top arm 32 along the spine 31. Actuation of the adjustment button 38 provides for free movement of the top arm 32 along the length of the spine 31. Releasing the adjustment button 38 restricts movement of the top arm 32 to a single position. Thus, the arm 32 may be moved between an open and a closed position as is necessary to insert and remove the roller 8. It will be appreciated that other means of freeing the roller 8 from the arms 32 and 34, such as detaching arm 8 from the apparatus entirely, are apparent to those of ordinary skill in the art.

The present invention provides a novel apparatus and method for aligning the brush 9 on the roller 8, with the tips 12 in a uniform pattern, once the brush 10 has been manually applied to the roller 8. In practice, a brush 10 is manually applied to the outer surface 9 of a roller 8. As can be seen in FIG. 4, at this point, the edges and surfaces 16a and 14a of the brush 10 are generally not aligned uniformly or consistently along the surface 9 of the roller 8. The adjustment button 38 is actuated, the arm 32 is biased into the open position and end 24 of the roller 8 is placed into the receptacle 35. The adjustment button 38 again actuated and arm 32 is returned to the closed position, with end 22 of the roller 8 placed in receptacle 33. A fluid source, such as a hose attached to a fluid reservoir (not pictured), is attached to the inlet 36 and the fluid is pumped under pressure into the inlet 36. One of ordinary skill in the art will appreciate that such fluid may comprise for example air, nitrogen gas, or water. However, that any liquid or gas possessing similar characteristics when acted upon by pressure will suffice. The fluid flows from inlet 36 through channel 21 and into internal cavity 20. When sufficient pressure exists in internal cavity 20, the fluid escapes from internal cavity 20 through the plurality of orifices 26. The fluid leaving the internal cavity 20 from the orifices 26 is of sufficient strength and pressure to form a layer of fluid between the outer surface 9 of the roller 8 and the inner surface 11 of the brush 10 that deforms the brush 10 outward, away from the outer surface 9 of the roller 8 on which it was seated. While distended by the cushion of fluid between the inner surface 9 of the brush 11 and the outer surface 9 of the roller 8, the roller is no longer substantially in frictional contact with the roller 8 and is held in place on the roller 8 by brush stops 46 and 47. As such, the brush 8 is allowed to return to its resting equilibrium shape in which the plurality of tips 12 are arrayed in alignment with each other throughout the entire surface area of the brush 10. It will be appreciated that the pressure required to provide the necessary distention of the brush will vary depending upon the material characteristics and size of the brush As can be seen in FIG 5, the edges and surfaces 16b and 14b of the brush 10 are generally now aligned uniformly along the surface 9 of the roller 8. The flow of fluid is then terminated, the cushion of fluid between the roller 8 and the brush 10 collapses and the brush 10 returns to its frictional contact with the surface 9 of the roller 8.

Further to the description set forth above, in operation of the method of the present invention the brush 10 is applied onto the surface of the roller 8 such that the inner surface 11 of the brush 10 and the outer surface of the roller 8 are in frictional communication or contact with one another. A layer of fluid is then generated between the surfaces of the roller 8 and the brush 10 sufficient to substantially dissipate any frictional contact between the brush 10 and the roller 8. The layer of fluid is maintained between the surfaces of the roller 8 and the brush 10 for sufficient time and at sufficient strength to allow the brush 10 to attain a position of static alignment, at which time the layer of fluid is allowed to dissipate thereby returning the brush 10 to a position of frictional contact or communication with the surface of the roller 8 while substantially retaining it in a state of static alignment.

Figure 8:
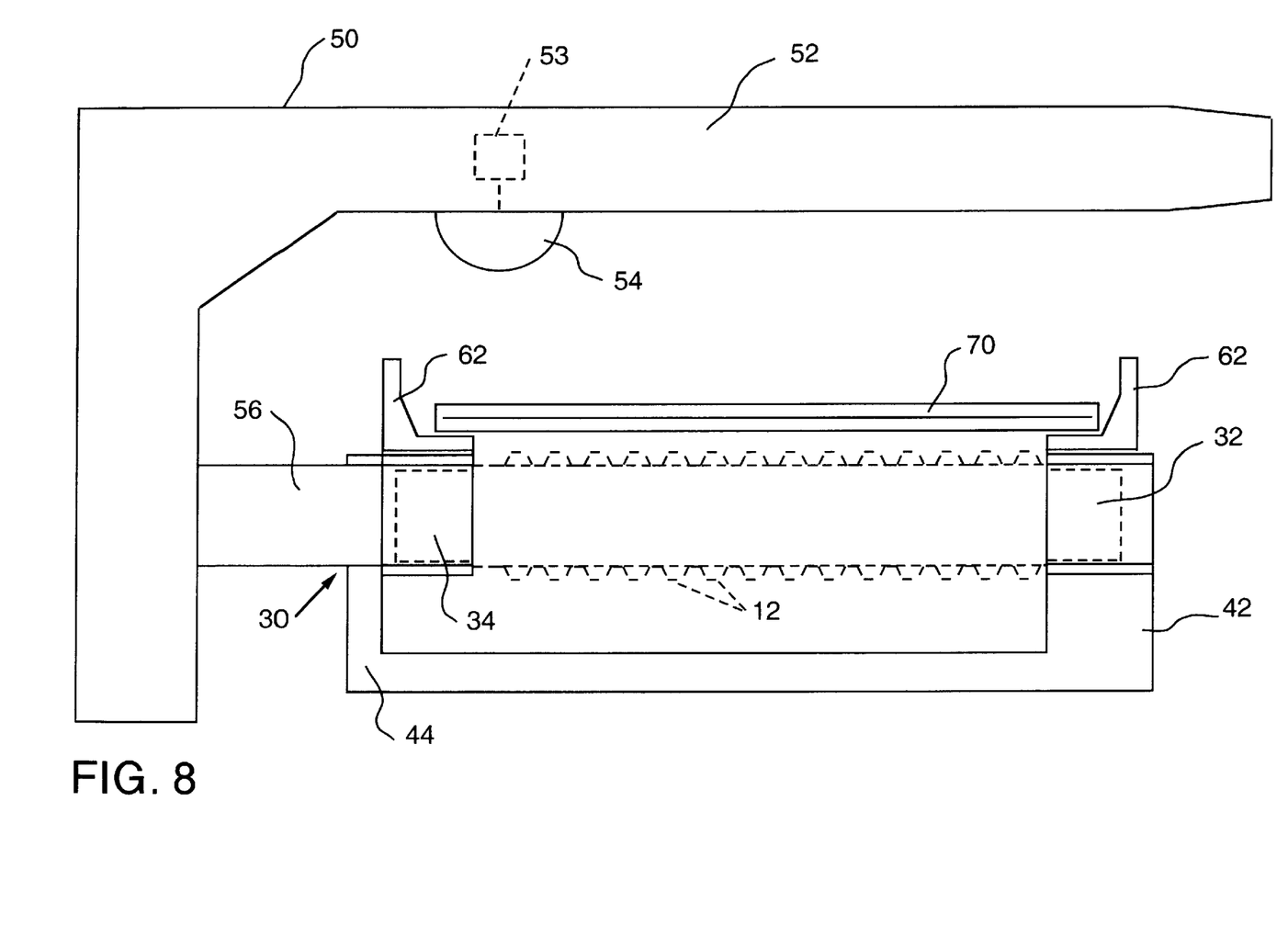
FIG. 8 is a side view of an On-Trak™ scrubber apparatus on which the embodiment in FIG. 1 may be utilized showing an image in phantom of the embodiment in FIG. 1 in use thereon.
Figure 9:
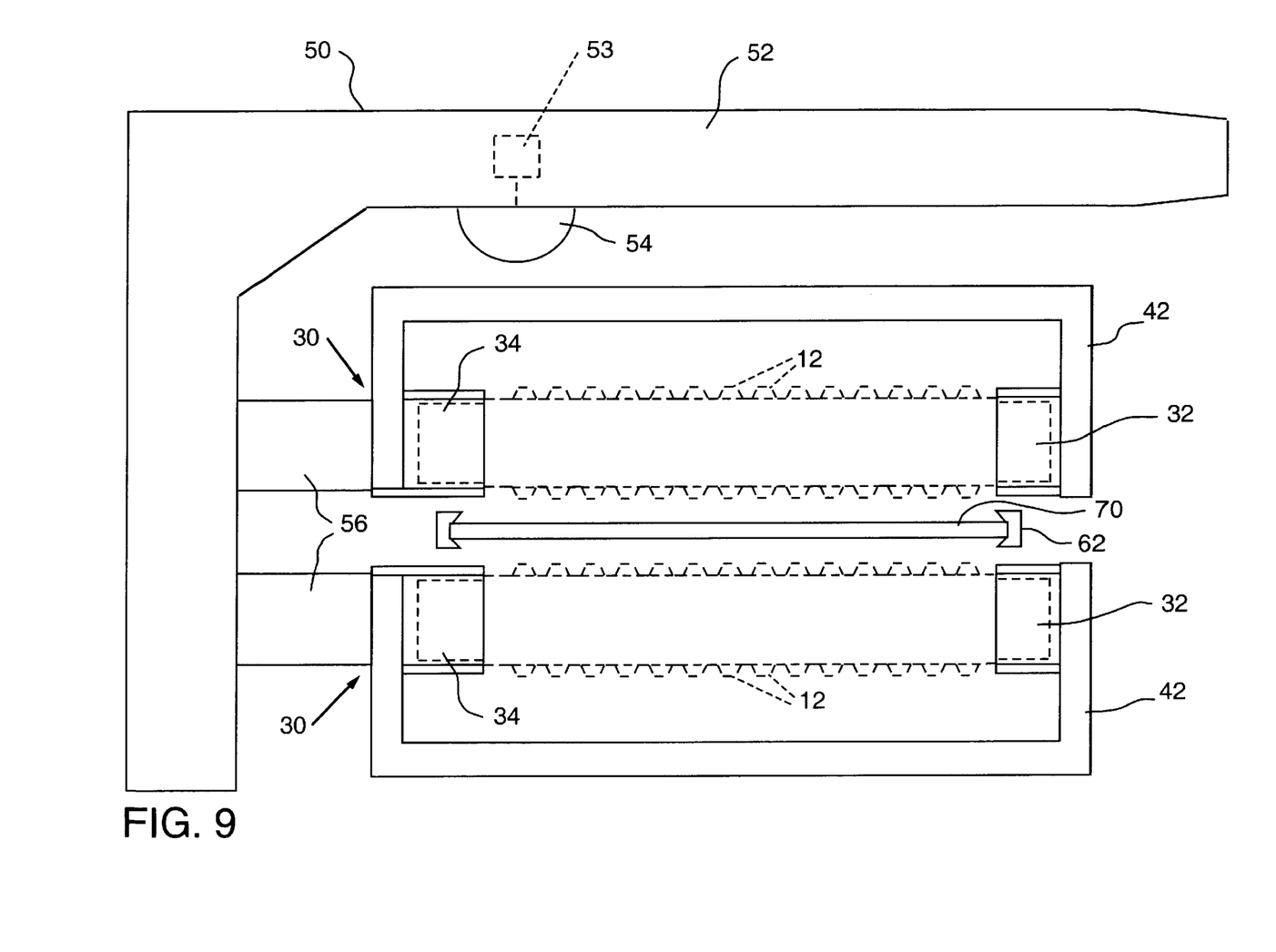
FIG. 9 is a side view of another On-Trak™ scrubber apparatus on which the embodiment in FIG. 1 may be utilized showing an image in phantom of the embodiment in FIG. 1 in use thereon.

FIGS. 8 and 9 depict the On-Trak™ scrubber unit 50 with which the preferred embodiment of the present invention is to be used. In FIG. 8 the scrubber unit 50 is adapted to be used with a single brush 10 for cleaning a single side of the semiconductor wafer 70 at one time. In operation, a semiconductor wafer 70 is held in contact with the tips of the brush 10 (shown in phantom) by wafer carrier 62. The wafer 70 is held in place while the brush 10 is rotated about drive shaft 56 and moved from one edge of the wafer 70 to the other along the diameter of the wafer 70. This process is then repeated as necessary until the entire surface of the wafer 70 has been cleaned. During this process, cleaning fluid may be discharged onto the surface of the wafer 70 to aid in the cleaning of the wafer 70. In alternative embodiments, the brush 10 may be held in a fixed position relative to the wafer 70 and be rotated about drive shaft 56 while the wafer 70 is spun about its center to accomplish the same result. The scrubber 50 in FIG. 9 operates in the same manner as the unit in FIG. 8, but is additionally adapted to be used with a second brush 10 so as to clean both surfaces of the wafer 70 simultaneously.

Those of ordinary skill in the art will, of course, appreciate that various changes in the details, materials and arrangements of parts which have been herein described and illustrated in order to explain the nature of the invention may be made by those skilled in the art within the principle and scope of the invention as expressed in the appended claims.

What is claimed is:

1. A method of aligning a brush on a roller comprising:
   mounting the brush onto the roller such that an inner surface of the brush and an outer surface of the roller are in frictional contact with one another;
   creating a layer of fluid between the surfaces of the roller and the brush to substantially dissipate said frictional contact between the brush and the roller;
   maintaining the layer of fluid between the surfaces of the roller and the brush to allow the brush to attain a position of static alignment with the outer surface of the roller; and
   eliminating the layer of fluid to return the brush to a position of frictional contact with the outer surface of the roller, while substantially retaining the position of static alignment.

2. The method of claim 1, wherein the brush is formed of a resilient material.

3. The method of claim 2, wherein the inner surface of the brush has a cross-sectional diameter generally equal to or smaller than a cross-sectional diameter of the outer surface of the roller.

4. A method of aligning a brush on a roller comprising:
   mounting the brush onto the roller such that an inner surface of the brush and an outer surface of the roller are in frictional contact with one another;
   employing a pressurized fluid source to create a layer of fluid between the surfaces of the roller and the brush to substantially dissipate said frictional contact between the brush and the roller;
   maintaining the layer of fluid between the surfaces of the roller and the brush to allow the brush to attain a position of static alignment with the outer surface of the roller; and eliminating the layer of fluid to return the brush to a position of frictional contact with the outer surface of the roller, while substantially retaining the position of static alignment.

5. The method of claim 4, wherein the pressurized fluid source is in fluid communication with the roller.

6. The method of claim 4, wherein the roller defines an internal cavity having a plurality of orifices which extend through the outer surface of the roller to the internal cavity thereof.

7. The method of claim 6, wherein the fluid passes through the plurality of orifices to create the layer of fluid between the surfaces of the roller and the brush and wherein said orifices permit the layer of fluid between the surfaces of the roller and the brush to be eliminated.

8. A method of cleaning a semiconductor wafer comprising:

mounting a brush onto a roller such that an inner surface of the brush and an outer surface of the roller are in frictional contact with one another;

creating a layer of fluid between the surfaces of the roller and the brush to substantially dissipate said frictional contact between the brush and the roller;

maintaining the layer of fluid between the surfaces of the roller and the brush to allow the brush to attain a position of static alignment with the outer surface of the roller;

eliminating the layer of fluid to return the brush to a position of frictional contact with the outer surface of the roller, while substantially retaining a state of static alignment with the outer surface of the roller; and rotating the brush about its axis while holding a wafer in frictional contact with the brush to clean a surface of the wafer.

9. The method of claim. 8, further comprising:

applying a cleaning fluid onto the surface of the wafer to be cleaned.

10. The method of claim 8, further comprising:

moving the brush laterally across the surface of the wafer until the surface of the wafer has been contacted by the brush.

11. The method of claim 8, wherein the brush is formed of a resilient material.

12. The method of claim 8, wherein the inner surface of the brush has a cross-sectional diameter generally equal to or smaller than a cross-sectional diameter of the outer surface of the roller.

13. A method of cleaning a semiconductor wafer comprising:

mounting a brush onto a roller such that an inner surface of the brush and an outer surface of the roller are in frictional contact with one another;

creating a layer of fluid between the surfaces of the roller and the brush to substantially dissipate said frictional contact between the brush and the roller;

maintaining the layer of fluid between the surfaces of the roller and the brush to allow the brush to attain a position of static alignment with the outer surface of the roller;

eliminating the layer of fluid to return the brush to a position of frictional contact with the outer surface of the roller, while substantially retaining the position of static alignment;

bringing a surface of a semiconductor wafer into frictional contact with the brush to clean the surface of the semiconductor wafer; and rotating the semiconductor wafer about its center.

14. The method of claim 13, further comprising applying a cleaning fluid onto the surface of the semiconductor wafer to be cleaned.

15. A method cleaning a semiconductor wafer comprising:

mounting a brush onto a roller such that an inner surface of the brush and an outer surface of the roller are in frictional contact with one another;

employing a pressurized fluid source to create a layer of fluid between the surfaces of the roller and the brush to substantially dissipate any frictional contact between the brush and the roller;

maintaining the layer of fluid between the surfaces of the roller and the brush to allow the brush to attain a position of static alignment with the outer surface of the roller;

eliminating the layer of fluid thereby returning the brush to a position of frictional contact with the outer surface of the roller, while substantially retaining the position of static alignment; and rotating the brush about its axis while holding a wafer in frictional contact with the brush to clean a surface of the wafer.

16. The method of claim 15, wherein the pressurized fluid source is in fluid communication with the roller.

17. The method of claim 16, wherein the roller defines an internal cavity having a plurality of orifices which extend through the outer surface of the roller to the internal cavity thereof.

18. The method of claim 17, wherein the fluid passes through the plurality of orifices to create the layer of fluid between the surfaces of the roller and the brush and wherein said orifices permit the layer of fluid between the surfaces of the roller and the brush to be eliminated.

19. A method of cleaning a semiconductor wafer comprising:

mounting a brush onto a roller such that an inner surface of the brush and an outer surface of the roller are in frictional contact with one another;

employing a pressurized fluid source to create a layer of fluid between the surfaces of the roller and the brush to substantially dissipate said frictional contact between the brush and the roller;

maintaining the layer of fluid between the surfaces of the roller and the brush to allow the brush to attain a position of static alignment with the outer surface of the roller;

eliminating the layer of fluid thereby returning the brush to a position of frictional contact with the outer surface of the roller, while substantially retaining the position of static alignment;

bringing a surface of a semiconductor wafer into frictional contact with the brush to clean the surface of the semiconductor wafer; and rotating the semiconductor wafer about its center.

* * * * *

UNITED STATES PATENT AND TRADEMARK OFFICE
CERTIFICATE OF CORRECTION

PATENT NO. : 6,331,213 B1
DATED : December 18, 2001
INVENTOR(S) : Brunelli et al.

It is certified that error appears in the above-identified patent and that said Letters Patent is hereby corrected as shown below:

Column 1,
Line 20, delete "a" and insert -- . -- therein.
Line 37, delete "cleaner" and insert -- cleaned. --.
Line 46, after "and" and on line 47 before "cleaned" remove spacing so that there is no new paragraph at line 47.

Column 2,
Line 16, after "undesirable", insert -- . -- therein.
Line 47, delete "outer the", and insert -- the outer -- therein.
Lines 55-56, delete "separated" and insert -- in -- therein.
Line 57, delete "," after "substantially".
Line 58, insert -- . -- after "fluid".

Column 3,
Line 16, delete "," and insert -- ; -- therein.
Line 18, delete "," and insert -- ; -- therein.
Line 63, insert "." after "therethrough".

Column 4,
Line 30, delete ".", after "is".
Line 48, after "roller 8", insert -- . -- therein.

Figure 3:
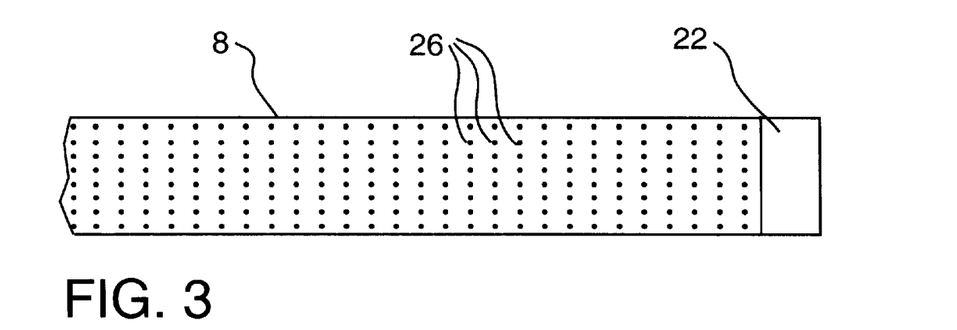
FIG. 3 is a side perspective view of the embodiment in FIG. 1 without a brush placed thereon.

Column 5,
Line 19, delete "FIG. 4" and insert -- FIG. 3 -- therein.
Line 52, after "brush", insert -- . -- therein.

Signed and Sealed this

Twenty-first Day of May, 2002

*Attest:*

*Attesting Officer*

JAMES E. ROGAN
*Director of the United States Patent and Trademark Office*